United States Patent [19]

Thornberg

[11] Patent Number: 5,360,948
[45] Date of Patent: Nov. 1, 1994

[54] VIA PROGRAMMING FOR MULTICHIP MODULES

[75] Inventor: Gary R. Thornberg, Colorado Springs, Colo.

[73] Assignee: NCR Corporation, Dayton, Ohio

[21] Appl. No.: 929,551

[22] Filed: Aug. 14, 1992

[51] Int. Cl.$^5$ ............................................. H05K 1/02
[52] U.S. Cl. .................................... 174/263; 174/255; 174/261; 174/250
[58] Field of Search ............... 174/250, 255, 261, 262, 174/263, 266

[56] References Cited

U.S. PATENT DOCUMENTS

| | | | |
|---|---|---|---|
| 3,142,112 | 7/1964 | Burkig et al. | 29/155.5 |
| 3,226,802 | 1/1966 | Goodwin, Jr. et al. | 29/155.5 |
| 3,436,819 | 4/1969 | Lumine . | |
| 3,564,114 | 2/1971 | Blinder et al. | 174/68.5 |
| 4,237,606 | 12/1980 | Nina et al. | 29/830 |
| 4,255,852 | 3/1981 | Johnson et al. | 29/837 |
| 4,407,007 | 9/1983 | Desai et al. | 357/74 |
| 4,438,560 | 3/1984 | Kisters | 29/830 |
| 4,535,388 | 8/1985 | Kraus et al. | 361/414 |
| 4,782,193 | 11/1988 | Linsker | 174/68.5 |
| 4,834,835 | 5/1989 | Cziep et al. | 156/643 |
| 4,847,732 | 7/1989 | Stopper et al. | 361/395 |
| 4,888,663 | 12/1989 | Longerich et al. | 361/385 |
| 4,915,983 | 4/1990 | Lake et al. | 427/98 |
| 4,933,045 | 6/1990 | DiStefano et al. | 156/630 |
| 4,982,495 | 1/1991 | Okamoto et al. | 174/259 X |
| 4,998,159 | 3/1991 | Shinohara et al. | 357/80 |
| 5,012,047 | 4/1991 | Dohga | 174/250 |

Primary Examiner—Leo P. Picard
Assistant Examiner—L. Thomas
Attorney, Agent, or Firm—James M. Stover

[57] ABSTRACT

A programmable multichip module (MCM) base substrate includes a first patterned signal layer comprising a plurality of electrical conductors formed in a first direction and a second patterned signal comprising a second plurality of electrical conductors formed perpendicular to the first group, thus forming a grid. The two signal layers are electrically insulated from each other as well as the substrate surfaces. A first plurality of vias provides openings from the surface of the base substrate to the first signal layer, and a second plurality of vias provide openings in the surface of the base substrate to the second signal layer. Substrate programming is accomplished utilizing via plate-up and surface metalization techniques to establish connections between conductors residing in the two signal layers and to define surface contact pads, and utilizing masking and etching procedures to cut open selected conductors at unmasked via sites.

8 Claims, 4 Drawing Sheets

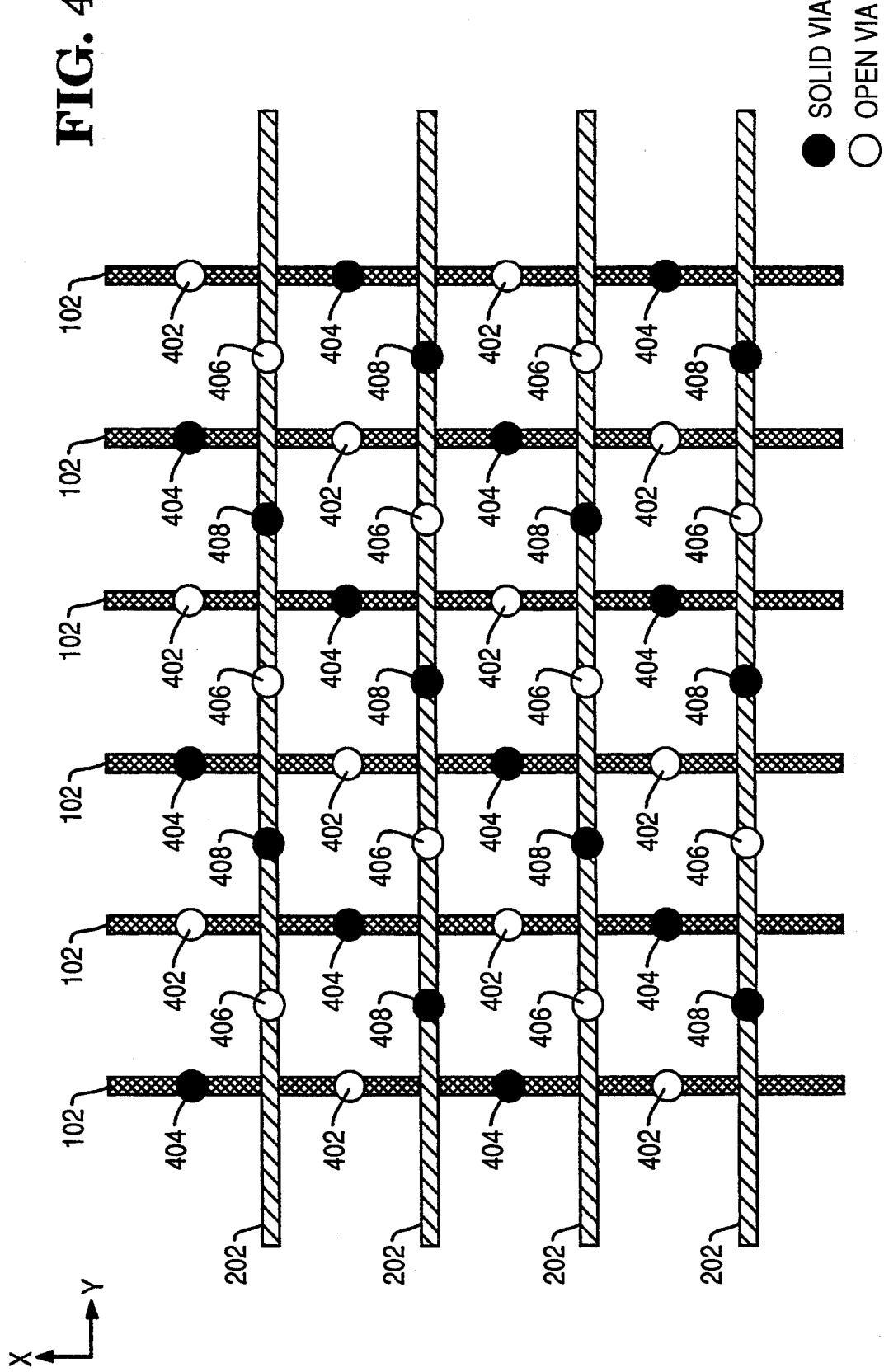

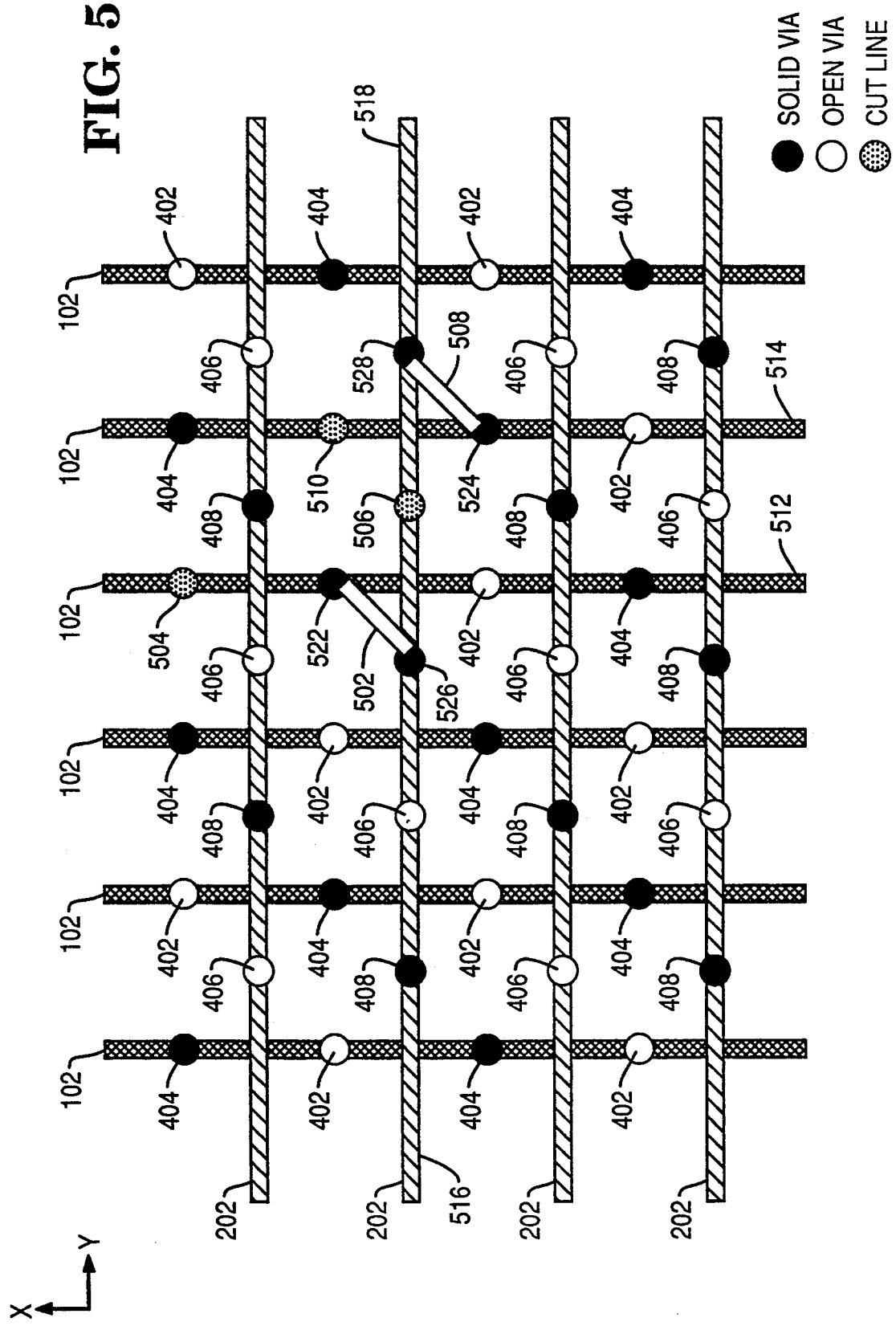

VIA PROGRAMMING FOR MULTICHIP MODULES

The present invention relates to multi-chip modules for semiconductor chips and, more particularly, to programmable multi-chip modules having two or more conductor planes which can be selectively interconnected or opened to establish signal paths between different points on the module.

1. Background of the Invention

A multi-chip module (MCM) is defined as any advanced semiconductor substrate which provides an interconnect path between electrical components mounted thereon. The electrical components are often integrated circuits, but may also comprise discrete circuit components such as resistors, capacitors, inductors, transistors and diodes. As the arrangement of components on a multi-chip module will vary according to each application, the process to prepare the multi-chip module base substrate for each application must also be varied, each different arrangement of components requiring a different layout and formation of signal paths along the multi-chip module substrate to properly interconnect the components. There exists a need for a simple and inexpensive technique which allows a basic multi-chip module substrate to be built and programmed.

2. Objects of the Invention

It is therefore an object of the present invention to provide a new and useful programmable base substrate for an MCM module.

It is another object of the present invention to provide such an MCM base substrate which is simple and inexpensive to manufacture and program.

It is a further object of the present invention to provide such a standard MCM base substrate which is mask programmable to complete MCM assembly.

It is also an object of the present invention to provide a programmable MCM base substrate including two or more patterned metal signal layers existing at different planes within the substrate, and a plurality of via holes between the substrate surface and the patterned signal layers.

It is yet another object of the present invention to provide a method for manufacturing programmable MCM base substrates which permits mass production of MCM substrates.

It is still a further object of the present invention to provide a method for manufacturing MCM substrates which utilizes the same steps, except for a final programming procedure, regardless of the arrangement of electrical components to be placed upon the substrate.

SUMMARY OF THE INVENTION

There is provided, in accordance with the present invention, a programmable base substrate for a multi-chip module (MCM), comprising a first patterned signal layer within the substrate; a second patterned signal layer within the substrate, the second signal layer being electrically insulated from the first signal layer; a first plurality of via openings, each via opening providing an opening from the surface of the base substrate to the first signal layer; and a second plurality of via openings, each one of the second plurality of via openings providing an opening in the surface of the base substrate to the second signal layer.

In the described embodiment, the MCM base substrate comprises a rectangular shaped semiconductor substrate. The first patterned signal layer comprises a plurality of electrical conductors formed parallel to a first edge of the base substrate and the second patterned signal layer comprises a second plurality of electrical conductors formed perpendicular to the first group, thus forming a grid. Substrate programming is accomplished utilizing via plate-up and surface metalization techniques to establish connections between conductors residing in the two signal layers, and utilizing masking and etching procedures to cut open selected conductors at unprotected via sites.

The above and other objects, features, and advantages of the present invention will become apparent from the following description and the attached drawings.

BRIEF DESCRIPTION OF THE DRAWINGS

FIG. 4 is a plan view of a base MCM substrate including first and second signal layers wherein open and plated up via holes have been provided from the substrate surface down to the first and second signal layers in accordance with a second embodiment of the present invention.

FIG. 5 is a plan view of the base substrate of FIG. 4 programmed to establish signal paths between different points on the module.

DETAILED DESCRIPTION OF THE PREFERRED EMBODIMENT

Those skilled in the art will recognize that the arrangement of components and circuitry on a multi-chip module will vary according to each application. With the foregoing in mind, the present invention provides a base substrate for a multi-chip module which permits standardization of the process of manufacturing MCM devices. The manufacture and construction of a programmable MCM semiconductor substrate will now be described with reference to FIGS. 1 through 4.

Figure 1:
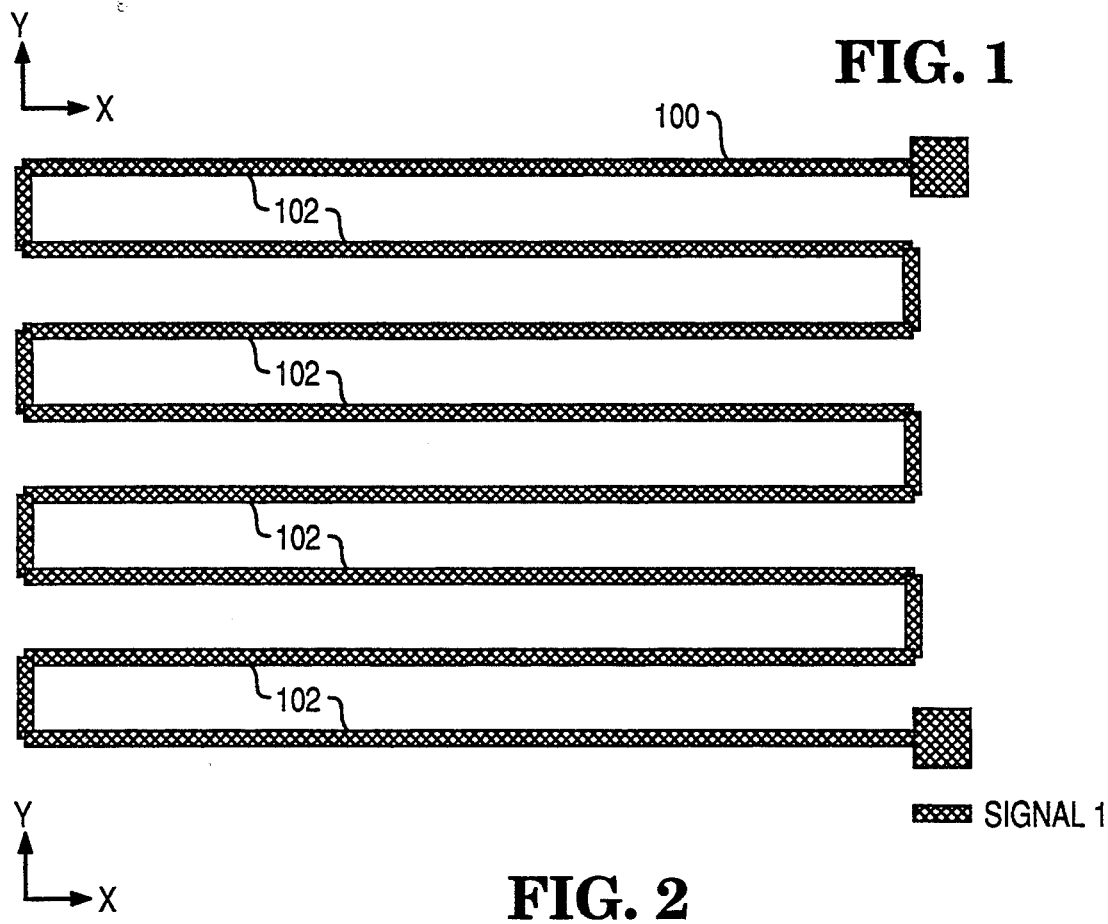
FIG. 1 is a plan view of a first metal signal layer developed in the X direction on a base multichip module (MCM) substrate.

The base structure for the MCM semiconductor substrate is manufactured utilizing, for example, copper/polyimide standard processing techniques through the first patterned metal signal layer, shown in FIG. 1. This base structure may include power and ground layers. First patterned signal layer 100 is developed in a continuous pattern forming a plurality of signal paths 102 in the X direction.

Figure 2:
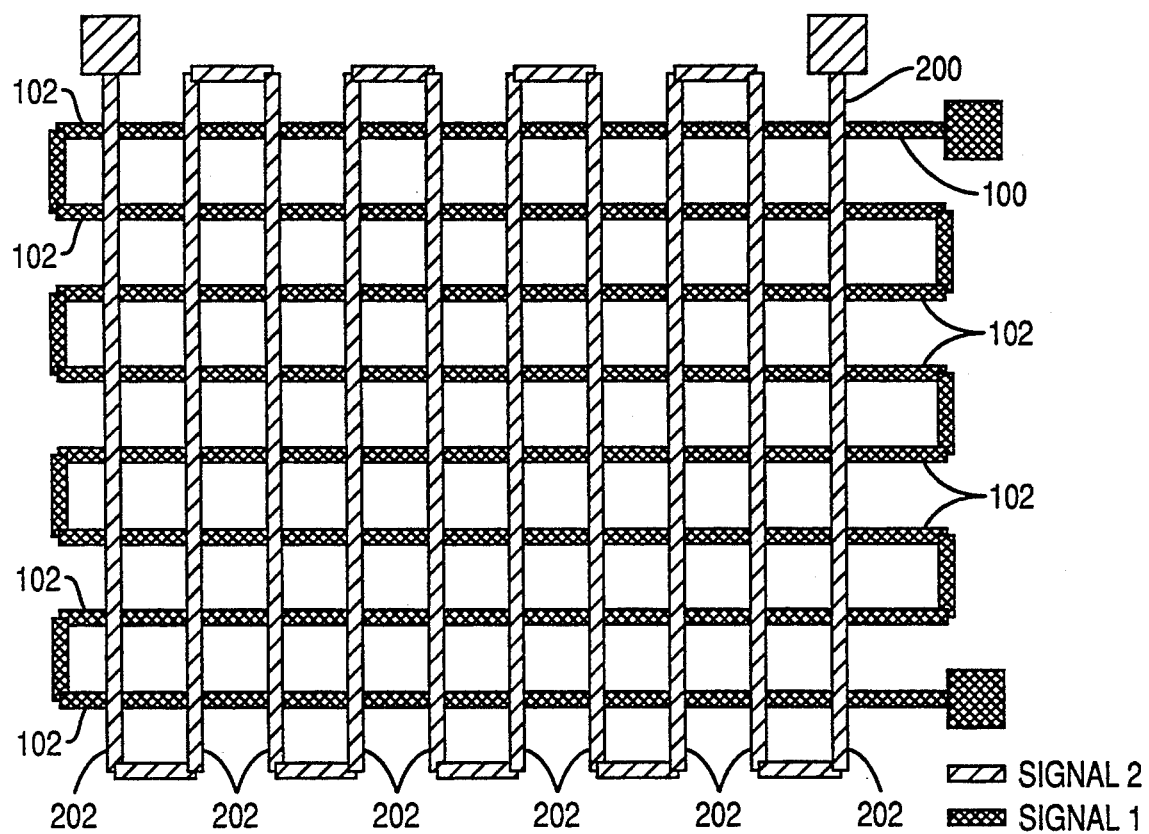
FIG. 2 is a plan view of a second metal signal layer developed in the Y direction on the base multichip module (MCM) substrate of FIG. 1.

The first patterned signal layer is thereafter covered with a polymer or polyimide coat, and a second patterned signal layer developed. FIG. 2 shows a second signal layer 200 as a continuous pattern including a plurality of signal paths 202 in the Y direction residing in a plane within the base substrate above signal layer 100, thus forming an XY grid. This second signal layer is also covered with a polymer or polyimide coat.

Figure 3:
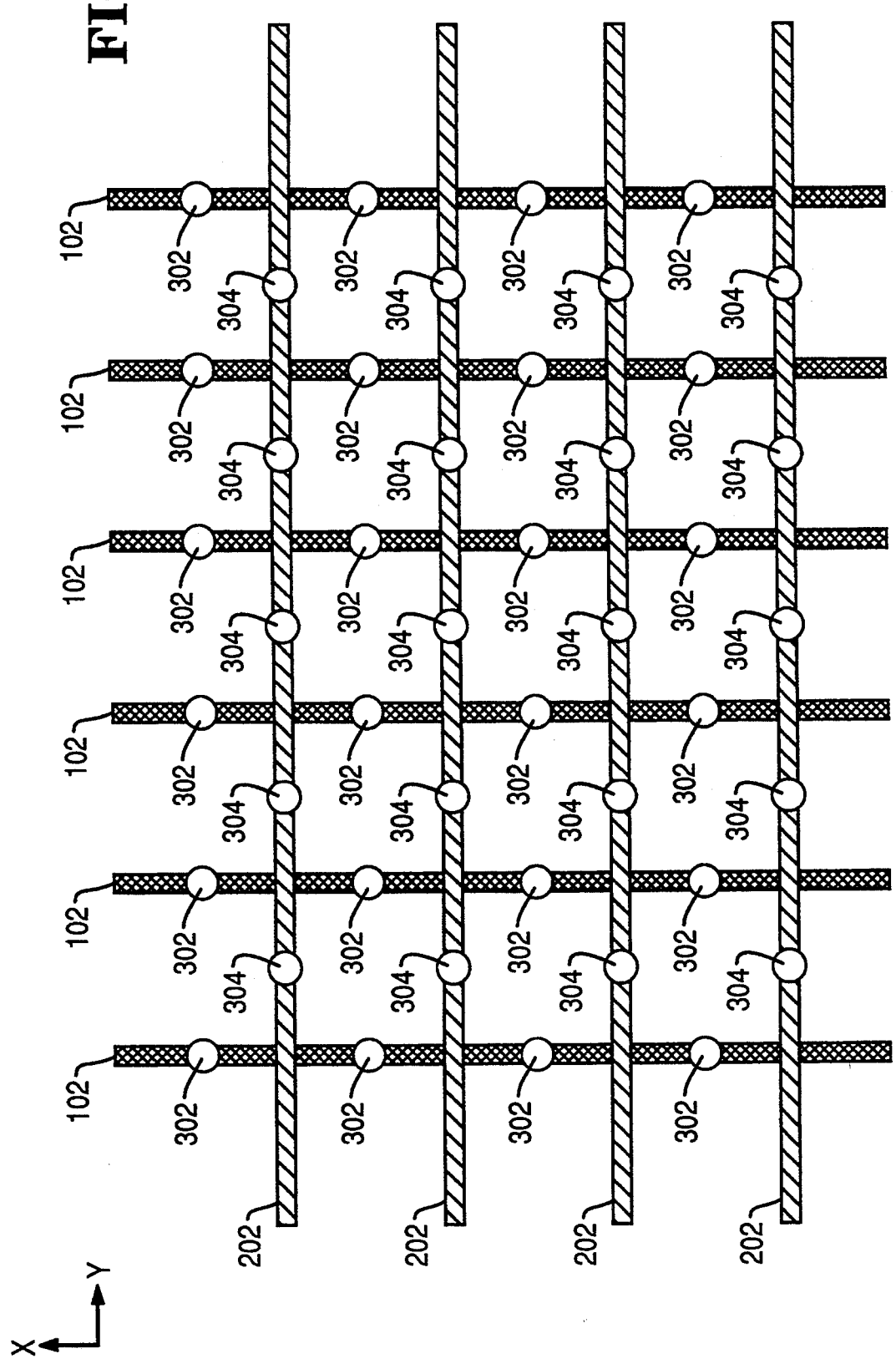
FIG. 3 is a plan view of the base MCM substrate of FIG. 2 wherein open via holes have been provided from the substrate surface down to the signal layers shown in FIGS. 1 and 2 in accordance with one embodiment of the present invention.

Manufacture of the MCM base substrate is completed with the opening of via holes 302 and 304 from the substrate surface down to signal layers 100 and 200, respectively, as shown in FIG. 3.

An alternative MCM base substrate structure is shown in FIG. 4. The MCM base substrate shown in FIG. 4 is developed through the first patterned signal layer as described above with reference to FIG. 1. The first signal layer is then coated with a photosensitive polyimide and via holes 404 are opened to predetermined connection points in the X-direction signal paths 102. Via holes 404 are then plated up with an electroless plating solution.

Formation of the MCM base substrate continues with the deposition of the second patterned signal layer above the first signal layer. The second patterned signal layer is covered with a photosensitive polyimide and via holes 408 opened to designated connection points in Y-direction signal paths 202. Via holes 404 are extended to the MCM base substrate surface, Via holes 404 and 408 are then plated up to the MCM base substrate surface.

A photoresist is utilized to define via holes 402 and 406 down to signal paths 102 and 202, respectively, and dry etch processing techniques employed to open via holes 402 and 406 through the polyimide layers. The final MCM base substrate thus includes plated up vias 404 and 408 from signal layers 100 and 200, respectively, for programming connections between the layers, and open via holes 402 and 406 for cutting traces in the first and second signal layers, respectively.

To program the completed base substrate shown in FIG. 3, the process sequence described below is employed. Basic circuit design and layout, provided by a computer-aided design (CAD) system, is utilized to generate a "line-open" mask for the second programming step. This mask protects all vias from a dry or wet etch process to open selected X and Y direction signal paths. A second CAD mask is generated to define component layout pads and via-to-via shorting routes.

The process sequence for programming an MCM base substrate and preparing the substrate for the mounting of surface components such as integrated circuit chips and discrete circuit elements is as follows:

1. A "line-open" mask identifying protected and unprotected vias is applied to the MCM base substrate and the base substrate is coated with photoresist.
2. Dry or wet etch processing is utilized to open designated signal paths in the first and second signal layers at unprotected via sites.
3. The photoresist is removed.
4. The base MCM substrate is coated with photosensitive polyimide.
5. Contact vias providing electrical contact between the substrate surface and the signal layers are defined and developed.
6. The photosensitive polyimide is cured.
7. A metal layer is deposited onto the substrate surface.
8. A mask defining the contact pads and electrical connections between vias associated with the X and Y signal layers is applied to the substrate surface and the substrate surface is coated with photoresist.
9. Etch processing is utilized to remove unprotected portions of the metal layer.
10. The photoresist is removed.
11. An overcoat protection, such as polyimide, is applied to the substrate.
12. Openings in the overcoat to provide access to the surface mounting pads are defined.
13. Programmed substrate developed and cured.

The MCM substrate is prepared for the surface mounting of integrated and discrete circuit components upon the conclusion of step 13.

Slight modifications to the module programming sequence described above are required to program the alternative base substrate shown in FIG. 4. The alternative base substrate shown in FIG. 4 includes plated up vias 404 and 408, therefore there is no requirement to develop plated up vias during module programming.

A plan view of the base substrate of FIG. 4, programmed to establish signal paths between different points on the module, is shown in FIG. 5. Conductors within signal layers 100 and 200 are cut through at via holes 504, 506 and 5 10 to form conductor segments 512 and 514 in the X direction and conductor segments 516 and 518 in the Y direction. Plated up vias 404 and 408 are thereafter shorted together by surface connector 502 during the surface metalization steps to connect X-direction conductor 512 with Y-direction conductor 516. Plated up vias 404 and 408 are similarly shorted together by surface connector 508 to connect X-direction conductor 514 with Y-direction conductor 518.

It can thus be seen that there has been provided by the present invention a standard, programmable, MCM semiconductor substrate manufactured utilizing well known dry etch processing and via plate up techniques. The standard MCM substrate includes two or more patterned signal layers and open via holes from the substrate surface to the signal layers. Plated up via hole providing electrical connection between points on the substrate surface and the signal layers may also be provided.

The base substrate allows programmable array-type multi-chip modules to be manufactured off a standard MCM base. Programming is accomplished by protecting or not protecting via sites during etching and surface metalization procedures. The top metal layer programming allows for use of all surface mount components, tape automated bonded (TAB) components, and flip chip components.

The greatest advantage presented by the present invention is the reduction in manufacturing cycle time and cost due to establishment of a standard MCM base manufacturing process and the minimization of programming steps required to prepare the base substrate for component installation.

Those skilled in the art will recognize that the invention is not limited to the specific embodiments described above and that numerous modifications and changes are possible without departing from the scope of the present invention. For example, the signal layers are not limited to the orientations and patterns shown in the Figures. In addition, signal layers in addition to the two layers shown and described may be provided. Fabrication processes other than those referred to above may be utilized to construct the MCM base substrate or to program the substrate. The substrate need not be rectangular, as shown in the Figures, and may be fabricated from silicon or semiconductor materials, organic or laminated compounds, or ceramic compounds.

These and other variations, changes, substitution and equivalents will be readily apparent to those skilled in the art without departing from the spirit and scope of the present invention. Accordingly, it is intended that the invention to be secured by Letters Patent be limited only by the scope of the appended claims.

What is claimed is:

1. A programmable base substrate for a multichip module (MCM), comprising:
   a first patterned signal layer within said substrate;
   a second patterned signal layer within said substrate, said second signal layer being electrically insulated from said first signal layer;
   a first plurality of via openings, each one of said first plurality of via openings providing an opening in said substrate to said first signal layer; and
   a second plurality of via openings, each one of said second plurality of via openings providing an opening in said substrate to said second signal layer;
   whereby said base substrate is programmed by depositing an electrically conductive material within selected via openings and on the surface of said base substrate to electrically connect selected sections of said first and second signal layers, and by cutting open selected sections of said first and second signal layers which are exposed by said via openings.

2. The programmable MCM base substrate according to claim 1, wherein:
   said first patterned signal layer comprises a first plurality of electrical conductors oriented in a first direction; and
   said second patterned signal layer comprises a second plurality of electrical conductors oriented in a second direction;
   whereby said base substrate is programmed by electrically connecting selected electrical conductors in said first and second signal layers by depositing an electrically conductive material on the surface of said base substrate to electrically connect plated-up via openings which are connected to said selected electrical conductors, and by cutting open selected electrical conductors within said first and second signal layers which are exposed by said open via openings.

3. The programmable MCM base substrate according to claim 2, wherein said second direction is othogonal to said first direction.

4. The programmable MCM base substrate according to claim 3, wherein:
   said base substrate comprises a rectangular shaped semiconductor substrate;
   said first plurality of electrical conductors are formed parallel to a first edge of said base substrate; and
   said second plurality of electrical conductors are formed perpendicular to said first edge of said base substrate.

5. The programmable MCM base substrate according to claim 1, further comprising:
   a first insulating layer residing between said first and second signal layers; and
   a second insulating layer residing between said second signal layer and the top surface of said base substrate.

6. The programmable MCM base substrate according to claim 5, wherein:
   said first patterned signal layer comprises a first plurality of electrical conductors oriented in a first direction; and
   said second patterned signal layer comprises a second plurality of electrical conductors oriented in a first direction.
   said first insulating layer comprises a polymer layer between said first and second signal layers; and
   said second insulating layer comprises a polymer coat over said second signal layer;
   whereby said base substrate is programmed by electrically connecting selected electrical conductors in said first and second signal layers by depositing an electrically conductive material on the surface of said base substrate to electrically connect plated-up via openings which are connected to said selected electrical conductors, and by cutting open selected electrical conductors within said first and second signal layers which are exposed by said open via openings.

7. The programmable MCM base substrate according to claim 1, wherein:
   said first plurality of via openings includes a first group of plated-up via openings, each one of said group of plated-up via openings providing an electrically conductive path between the top surface of said base substrate and one of said first plurality of electrical conductors, and a first group of open via openings;
   said second plurality of via openings includes a second group of plated-up via openings, each one of said second group of plated-up via openings providing an electrically conductive path between the top surface of said base substrate and one of said second plurality of electrical conductors, and a second group of open via openings;
   whereby said base substrate is programmed by electrically connecting selected electrical conductors in said first and second signal layers by depositing an electrically conductive material on the surface of said base substrate to electrically connect plated-up via openings which are connected to said selected electrical conductors, and by cutting open selected electrical conductors within said first and second signal layers which are exposed by said open via openings.

8. The programmable MCM base substrate according to claim 1, further comprising:
   a ground plane within said substrate, said ground plane being electrically insulated from said first and second signal layers; and
   a power plane within said substrate, said power plane being electrically insulated from said first and second signal layers and said ground plane.

* * * * *